United States Patent
Byun et al.

(10) Patent No.: US 10,704,145 B2
(45) Date of Patent: Jul. 7, 2020

(54) REACTION CHAMBER FOR CHEMICAL VAPOR APPARATUS

(71) Applicant: Korea Institute Of Industrial Technology, Chungcheongnam-do (KR)

(72) Inventors: Chul Soo Byun, Seoul (KR); Man Cheol Han, Seoul (KR)

(73) Assignee: KOREA INSTITUTE OF INDUSTRIAL TECHNOLOGY, Cheoan-si, Chungcheongnam-Do (KR)

( * ) Notice: Subject to any disclaimer, the term of this patent is extended or adjusted under 35 U.S.C. 154(b) by 309 days.

(21) Appl. No.: 15/518,758

(22) PCT Filed: Oct. 13, 2015

(86) PCT No.: PCT/KR2015/010757
§ 371 (c)(1),
(2) Date: Apr. 12, 2017

(87) PCT Pub. No.: WO2016/060429
PCT Pub. Date: Apr. 21, 2016

(65) Prior Publication Data
US 2017/0233869 A1    Aug. 17, 2017

(30) Foreign Application Priority Data
Oct. 13, 2014 (KR) .......................... 10-2014-0137876

(51) Int. Cl.
*C23C 16/455* (2006.01)
*C23C 16/44* (2006.01)
(Continued)

(52) U.S. Cl.
CPC .... *C23C 16/45565* (2013.01); *C23C 16/4401* (2013.01); *C23C 16/458* (2013.01);
(Continued)

(58) Field of Classification Search
None
See application file for complete search history.

(56) References Cited

U.S. PATENT DOCUMENTS 6,296,747 B1 * 10/2001 Tanaka ................ C23C 14/345
204/298.07
2004/0083978 A1 * 5/2004 Welch ............... H01J 37/32458
118/733
(Continued)

FOREIGN PATENT DOCUMENTS

JP    2006009144 A    1/2006
JP    2011029211 A    2/2011
(Continued)

OTHER PUBLICATIONS

WIPO, Korean International Search Authority, International Search Report and Written Opinion dated Feb. 11, 2016 in International Patent Application No. PCT/KR2015/010757, 10 pages.

*Primary Examiner* — Binu Thomas
(74) *Attorney, Agent, or Firm* — Masuvalley & Partners

(57) ABSTRACT

A reaction chamber for a chemical vapor apparatus is disclosed. The reaction chamber for the chemical vapor apparatus comprises a housing including an internal space and a susceptor disposed in the internal space so that a substrate is loaded on an upper surface of the susceptor. A shower head is disposed above the susceptor in the internal space of the housing to spray process gas towards the substrate side. An inner barrel with open top and bottom is placed inside the internal space of the reaction chamber so that an upper edge of the barrel is positioned near the showerhead to enclose the substrate and the susceptor. A driving part is connected to the inner barrel. When it is needed to replace the susceptor and the substrate, the inner barrel is changed into an open state in which the substrate and the susceptor disposed in the inner barrel are exposed to (Continued)

the outside of the inner barrel by an operation of the driving part. The inside of the reaction chamber for the chemical vapor apparatus is always closed and thus the reaction chamber is capable of easily replacing a substrate or a susceptor while the vacuum in the reaction chamber is still maintained.

8 Claims, 9 Drawing Sheets

(51) Int. Cl.
  *H01J 37/32* (2006.01)
  *C23C 16/458* (2006.01)
  *C23C 16/46* (2006.01)
(52) U.S. Cl.
  CPC .. *C23C 16/45519* (2013.01); *C23C 16/45589* (2013.01); *C23C 16/46* (2013.01); *H01J 37/3244* (2013.01); *H01J 37/32477* (2013.01); *H01J 37/32633* (2013.01)

(56) References Cited

U.S. PATENT DOCUMENTS

| | | | |
|---|---|---|---|
| 2004/0149214 A1* | 8/2004 | Hirose | H01J 37/32458 118/715 |
| 2005/0268852 A1* | 12/2005 | Hatanaka | C23C 16/0236 118/723 VE |
| 2012/0244684 A1* | 9/2012 | Suzuki | C23C 16/45517 438/478 |
| 2014/0260544 A1* | 9/2014 | Rasheed | H01J 37/3244 73/31.04 |
| 2016/0093473 A1* | 3/2016 | Moon | H01J 37/32642 216/58 |

FOREIGN PATENT DOCUMENTS

| | | |
|---|---|---|
| KR | 20090112361 A | 10/2009 |
| KR | 20110062859 A | 6/2011 |
| KR | 20110075177 A | 7/2011 |
| KR | 101224520 B2 | 1/2013 |
| KR | 20130076469 A | 7/2013 |

* cited by examiner

REACTION CHAMBER FOR CHEMICAL VAPOR APPARATUS

RELATED APPLICATIONS

This application is the U.S. National Phase of and claims priority to International Patent Application No. PCT/KR2015/010757, International Filing Date Oct. 13, 2015, entitled Reaction Chamber For Chemical Vapor Apparatus; which claims benefit of Korean Application No. KR10-2014-0137876 filed Oct. 13, 2014 entitled A Reactor Chamber For Chemical Vapor Deposition; both of which are incorporated herein by reference in their entireties.

TECHNICAL FIELD

The present invention relates to a reaction chamber for a chemical vapor apparatus.

BACKGROUND ART

Chemical vapor deposition is a process in which a raw material supplied into a reaction chamber in a vacuum state is decomposed using heat or plasma and is then chemically reacted to deposit a film on a substrate.

A conventional chemical vapor deposition apparatus is configured to include a reaction chamber that is isolated from the outside and maintains a vacuum; a raw material inlet for supplying a raw material into the reaction chamber; a heater for chemically reacting the supplied raw material; an outlet for discharging a process gas; and a susceptor positioned in a center of the reaction chamber and provided so that an object to be deposited or a substrate is placed thereon, wherein film deposition occurs on the object or the substrate.

In the above chemical vapor deposition apparatus, there is a problem in that the process gas flowing into the reaction chamber is undesirably deposited on an inner surface of the reaction chamber, a showerhead, and the like. The resultantly formed film is peeled from the portion on which the film is deposited due to various reasons such as repeated thermal expansion and contraction and acts as a contaminant source which contaminates an inside of the reaction chamber, thereby significantly reducing the overall production yield.

In order to solve this problem, a solution in which an internal chamber is provided in the reaction chamber not to allow the process gas to come into contact with the inner surface of the reaction chamber and, in some cases, only the internal chamber can be detached and replaced to prevent a process delay caused by a cleaning process from being generated has been proposed.

However, since the above internal chamber is disposed on a lower side of the reaction chamber and is fixedly mounted to an inside of the reaction chamber, a method in which an upper plate (a lid) of the reaction chamber is raised and moved together with an inner barrel has been utilized, in order to replace the substrate or the susceptor after the deposition process.

In this case, the inside of the reaction chamber is open, and the vacuum in the reaction chamber cannot be maintained. Therefore, there is a problem in that the overall productivity is deteriorated.

INVENTION

Technical Problem

An objective of one embodiment of the present invention is to provide a reaction chamber for a chemical vapor apparatus capable of easily replacing a substrate or a susceptor in which vacuum in the reaction chamber is maintained.

Technical Solution

According to one aspect of the present invention, provided is the reaction chamber for the chemical vapor apparatus including a housing having an internal space; a susceptor disposed in the internal space and provided so that a substrate is loaded on an upper surface thereof; a showerhead disposed in the internal space to be placed above the susceptor and provided to spray a process gas toward the substrate side; an inner barrel formed in a hollow shape having an open upper portion, an open lower portion, and a predetermined height, and being disposed in the internal space so that an upper edge thereof is positioned at a periphery of the showerhead to surround the substrate and the susceptor; and a driving part connected to the inner barrel via a power transmission part as a medium, wherein, in case of replacing the susceptor and the substrate, a state of the inner barrel is changed into an open state so that the substrate or the susceptor disposed in the inner barrel is exposed to the outside of the inner barrel by an operation of the driving part.

The inner barrel may include a plurality of through holes formed therein so that a purge gas flows into the inner barrel from the outside.

A gate valve may be provided on a side portion of the housing at a location corresponding to a location of the susceptor, and the susceptor or the substrate may be loaded or unloaded through the gate valve so that a replacement process of the susceptor or the substrate can be performed.

The inner barrel may be provided with a protrusion extending inward from an upper edge of the inner barrel and being disposed to be in contact with the showerhead via an end portion thereof.

In case of replacing the susceptor or the substrate, the inner barrel may be lifted by a predetermined height upward to position a lower edge of the inner barrel above the susceptor.

In case of replacing the susceptor or the substrate, the entirety of the inner barrel may be lifted by a predetermined height upward.

In case of replacing the susceptor or the substrate, a part of the inner barrel may be lifted by a predetermined height.

The inner barrel may be provided with a first section and a second section having shapes that can be merged each other, and only the second section may be lifted or lowered along a height direction with respect to the first section by the driving part.

A contact surface of the first section and a contact surface of the second section may be respectively provided with a protrusion and a groove corresponding to each other so that the protrusion may be slidably inserted into the groove, and the protrusion or the groove may be slidably moved along the corresponding groove or the corresponding protrusion when the second section is lifted or lowered.

The power transmission part may include a support rod having a predetermined length, and a lower end of the support rod is connected to one side of the second section, and an upper end thereof is connected to the driving part to transmit a driving force.

The inner barrel may be disposed to space a lower edge thereof by a predetermined height from the bottom surface of the housing and, in case of replacing the susceptor or the substrate, the inner barrel may be lowered downward to position the upper edge below the susceptor.

A guide member may be provided on the bottom surface of the housing to be protruded the predetermined height from the bottom surface of the housing, and the lower edge of the inner barrel may be inserted into the guide member to guide a moving direction of the inner barrel when the inner barrel is lifted or lowered.

The power transmission part may include a plurality of support rods connected to one side of the inner barrel via lower ends thereof and extending upward by a predetermined height; and an upper frame connecting the upper ends of the support rods to each other, wherein the upper frame may be connected to the driving part to transmit a driving force.

The susceptor may be disposed on an upper surface of a support block including a heater.

The driving part may be disposed outside the housing.

Advantageous Effects

A reaction chamber for a chemical vapor apparatus according to one embodiment of the present invention can conveniently replace a substrate or a susceptor in a state in which vacuum is maintained.

MODES OF THE INVENTION

Figure 1:
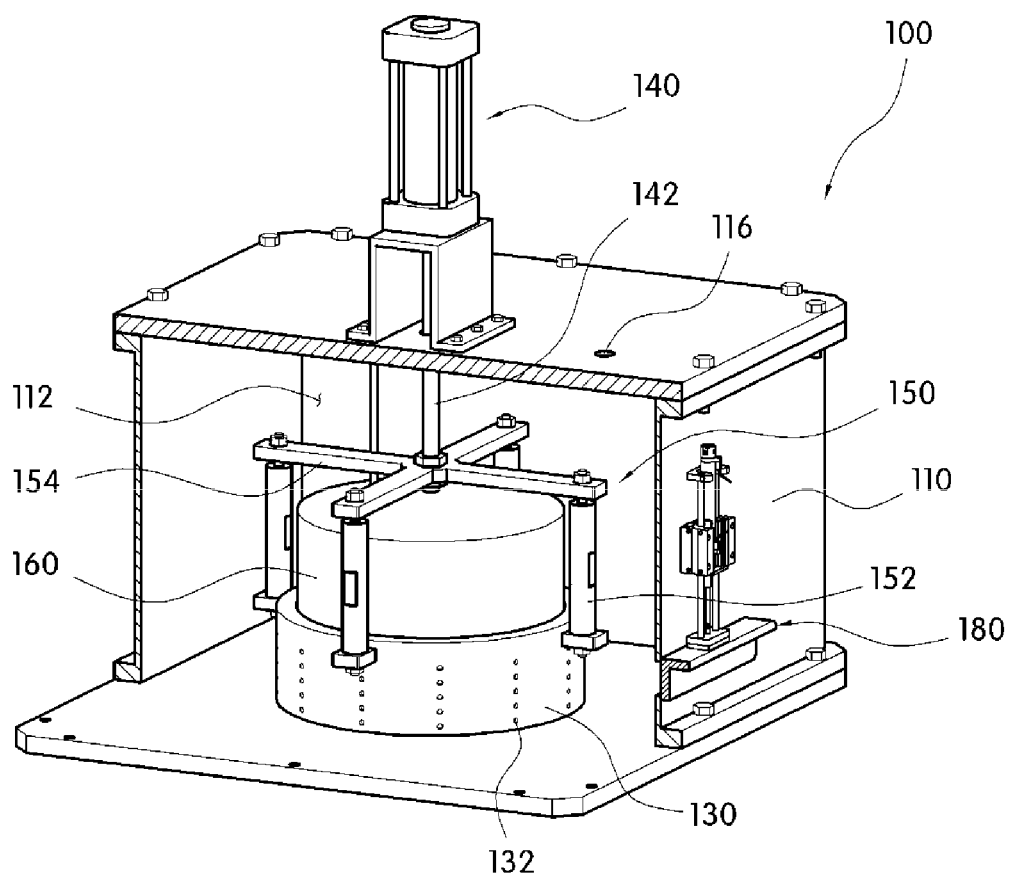
FIG. 1 is a perspective view illustrating an entire reaction chamber for a chemical vapor apparatus according a first embodiment of the present invention.

Hereinafter, exemplary embodiments of the present invention will be described in detail with reference to the accompanying drawings so as to enable those of ordinary skill in the art to easily embody and practice the invention. The present invention may be implemented in various forms, and is not limited to the exemplary embodiments disclosed herein. Elements which are not related to the description will be omitted in the drawings in order to clearly describe the present invention, and the same reference numerals have been assigned to the same or similar components throughout the specification.

Hereinafter, a reaction chamber for a chemical vapor apparatus according to one embodiment of the present invention will be described in more detail with reference to the drawings.

As shown in FIGS. 1 to 9, a reaction chamber 100, 100' or 200 for a chemical vapor apparatus according to one embodiment of the present invention includes a housing 110, a susceptor 120, a showerhead 160, an inner barrel 130, 130' or 230, and a driving part 140.

The housing 110 is provided with an internal space 112 in which the susceptor 120, the showerhead 160, the inner barrel 130, 130' or 230, and the like may be disposed.

In other words, the showerhead 160 for spraying a process gas supplied from the outside toward the substrate 101 is provided at an upper side of the internal space 112, and the susceptor 120 is disposed below the showerhead 160, wherein the substrate 101 is loaded on an upper surface of the susceptor.

In addition, the susceptor 120 is disposed on an upper surface of a support block 170 which is lifted or lowered by a cylinder (not shown) so that a location of the susceptor in the internal space 112 may be adjusted.

Here, the support block 170 has a configuration provided for supporting the substrate 101 to be processed and the susceptor 120 on which the substrate 101 is loaded, and various elements such as an electrode member provided in the internal space 112 for applying electrical power, an electric heating member for controlling a temperature of the substrate 101, and the like may be installed on the support block. In addition, a heater (not shown) may be provided on an upper side of the support block 170 to efficiently perform processing of the substrate.

Meanwhile, each of a process gas inlet 114 for supplying the process gas to the showerhead 160 and a purge gas inlet 116 for supplying a purge gas into the internal space 112 is provided on one side of the housing 110. At this time, the purge gas inlet 116 is provided at a location which communicates with the internal space 112 formed between an inner wall of the housing 110 and an outer surface of the inner barrel 130, 130' or 230.

Accordingly, the purge gas flows through a through hole 132 formed on the inner barrel 130, 130' or 230 into the inner barrel 130, 130' or 230 to prevent the process gas from being diffused to the outside and to prevent the process gas from coming into contact with an inner wall of the inner barrel 130, 130' or 230.

Here, the process gas refers to a raw material gas directly involved in film formation through a chemical reaction such as pyrolysis and bonding, and is a mixture obtained by vaporizing a main raw material, which is in a liquid phase and contains a film component to be deposited, using a carrier gas.

Additionally, the purge gas is a gaseous substance which has difficulty decomposing or making by-products by itself, and refers to Ar, $N_2$, He, $H_2$, and the like used as a carrier gas, high-purity Ar and $N_2$ used for dilution, or $O_2$ which, even when participating in the reaction, has difficulty decomposing or making by-products by itself. Such a purge gas has a characteristic that it is easily diffused due to low molecular weight thereof, is relatively less affected by forced circulation due to an action of a vacuum pump, and does not cause deposition, adsorption, or another surface reaction on an internal structure of the reaction chamber.

Meanwhile, a gate valve 180 is provided on a side portion of the housing 110 to enable a robot arm (not shown) to enter or withdraw into or from the internal space 112 of the housing 110 from or to a transfer chamber (not shown). Due to the above, when the substrate 101 or the susceptor 120 needs to be replaced, the robot arm holding the substrate 101 or the susceptor 120 approaches the support block 170 through the gate valve 180 so that the substrate 101 or the susceptor 120 may be easily replaced in a vacuum state.

Here, the gate valve 180 is formed to be substantially collinear with an upper surface of the support block 170 so that an operation for replacing the substrate 101 or the susceptor 120 with the robot arm may be easily performed.

Reference numeral 118 denotes an outlet 118 for discharging the process gas and the purge gas, which are supplied into the inner barrel 130, 130' or 230 for processing the substrate 101, to the outside. The outlet 118 is formed on a bottom surface of the housing 110 and positioned below the inner barrel 130, 130' or 230 so that the process gas and the purge gas supplied into the inner barrel 130, 130' or 230 may be smoothly discharged to the outside.

The showerhead 160 is disposed in the internal space 112 and serves to receive the process gas from the process gas inlet 114 and to spray the process gas toward the substrate 101 disposed therebelow.

Although the above showerhead 160 may be provided as a single module, the showerhead 160 may be constituted as an assembly in which a plurality of modules are stacked. Since the above configuration is well known, a detailed description thereon is omitted.

The inner barrel 130, 130' or 230 is placed below the showerhead 160 to enable the process gas sprayed from the showerhead 160 to be sprayed toward the substrate 101 without spreading outward.

The above inner barrel 130 is formed in a hollow shape having an open upper portion and an open lower portion and have a predetermined height, and is disposed so that an upper edge thereof to be positioned outside the showerhead 160 and the substrate 101 and the susceptor 120 disposed below the showerhead 160 may be disposed in and surrounded by the inner barrel. Here, the inner barrel 130 may be formed in a cylindrical shape or may have a polygonal column shape including a rectangular column shape and a triangular column shape, or a combination thereof.

At this time, the inner barrel 130 may be disposed in the internal space 112 so that a lower edge thereof is in direct contact with the bottom surface of the housing or in contact with a support portion (not shown) protruding a predetermined height from the bottom surface of the housing.

Due to the above, the substrate 101 and the susceptor 120 disposed in the inner barrel 130 are surrounded by the inner barrel 130 and the bottom surface of the housing or by the inner barrel, the support portion, and the bottom surface of the housing.

In addition, the inner barrel 130, 130' or 230 is provided with a protrusion 134 disposed to extend inward from the upper edge of the inner barrel and be in contact with a side portion of the showerhead 160 via an end portion thereof.

Accordingly, the inner barrel 130 or 230 serves as a separate partition for dividing the internal space 112 so that the substrate 101 and the susceptor 120 may be disposed in the inner barrel, thereby preventing the process gas sprayed from the showerhead 106 from being diffused out of the inner barrel 130.

At this time, a plurality of through holes 132 are formed on the inner barrel 130, 130' or 230 to enable the purge gas supplied into the housing 110 through the purge gas inlet 116 to flow into the inner barrel 130, 130' or 230 therethrough.

Since the purge gas flows into the inner barrel 130, 130' or 230 through the through holes 132, it may prevent the process gas sprayed from the showerhead 160 toward the substrate 101 from coming into contact with an inner surface of the inner barrel 130, 130' or 230.

Meanwhile, the inner barrel 130,130' or 230 of the respective reaction chamber 100, 100' or 200 for a chemical vapor apparatus according to one embodiment of the present invention is configured such that a part of or the entirety of the inner barrel is lifted or lowered by the driving part 140 to change a state of the inner barrel into an open state so that the substrate 101 or the susceptor 120 disposed in the inner barrel 130,130' or 230 is exposed to the outside of the inner barrel so that replacement of the substrate 101 or the susceptor 120 can be easily performed through the gate valve 180.

Figure 2:
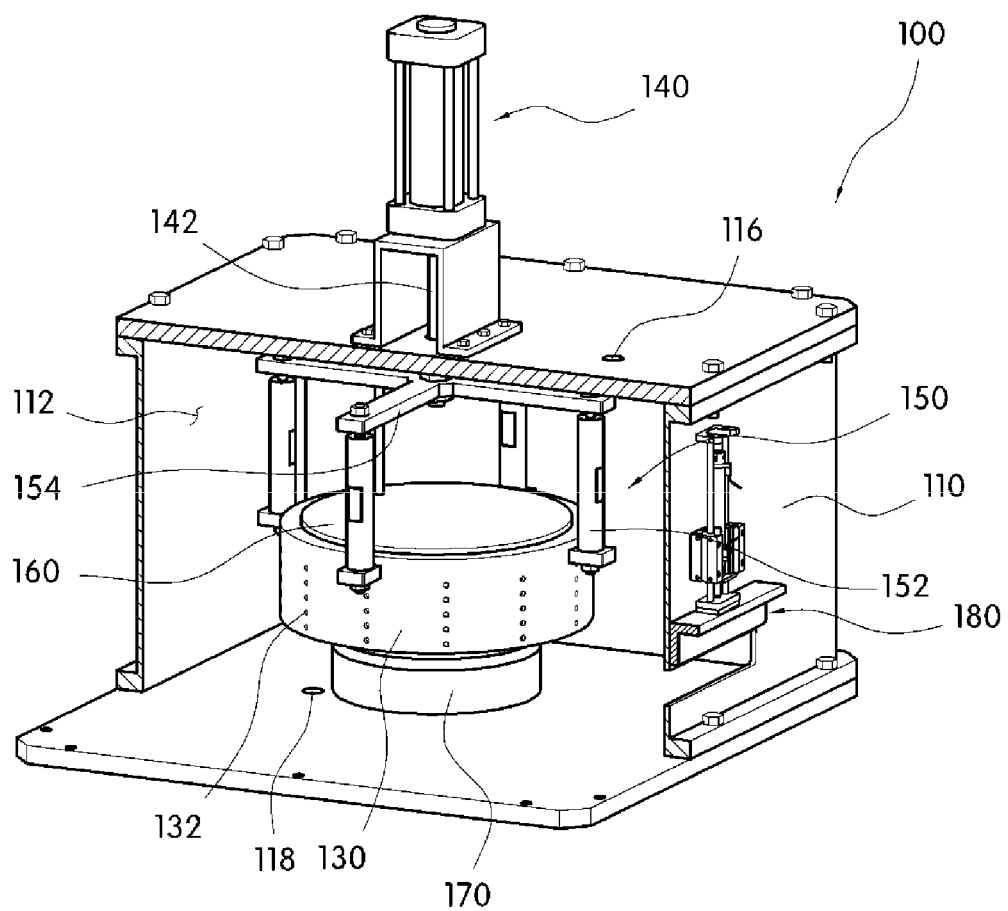
FIG. 2 is a view illustrating a state in which an inner barrel is lifted to replace a substrate or a susceptor in FIG. 1.
Figure 3:
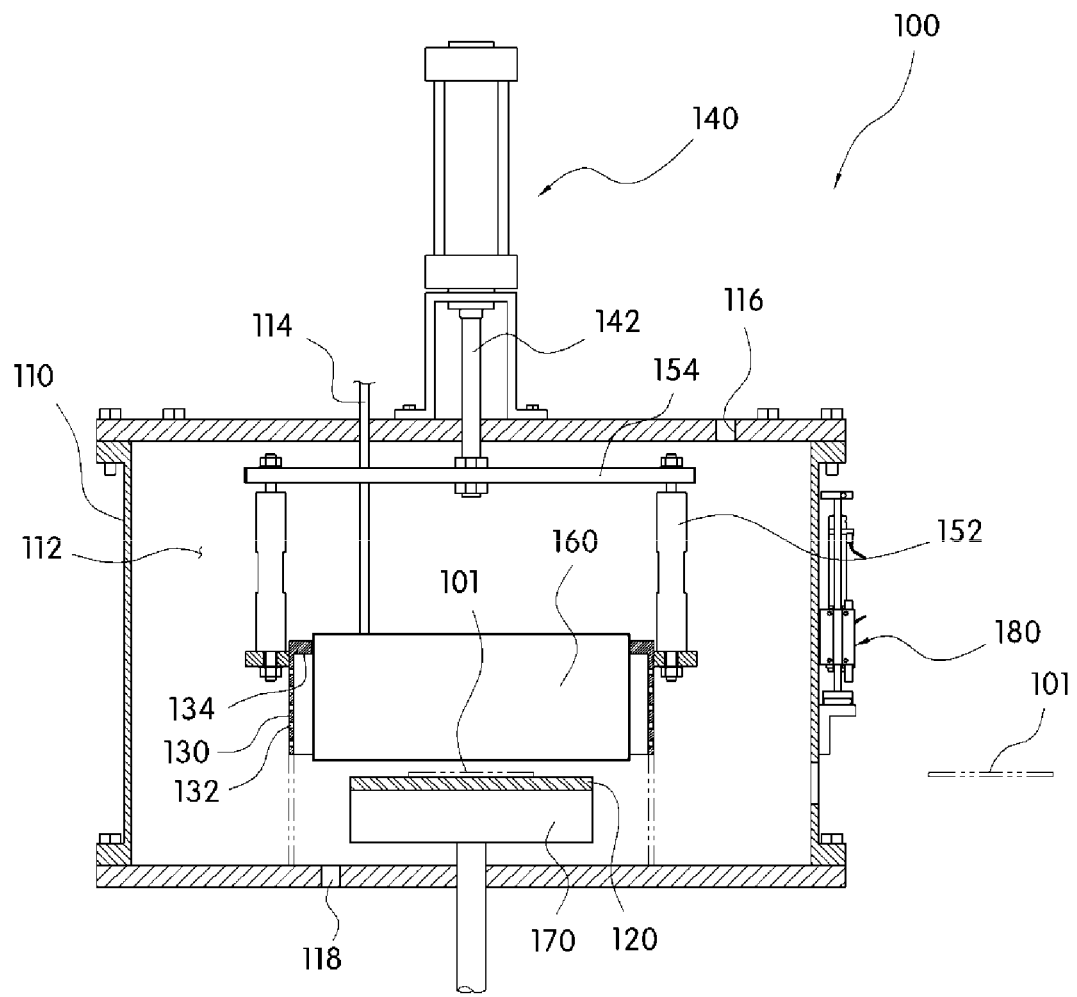
FIG. 3 is a cross-sectional view illustrating the reaction chamber for a chemical vapor apparatus according the first embodiment of the present invention.

As one embodiment the entire inner barrel 130 may be lifted from the bottom surface of the housing 110 to enable the substrate 101 or the susceptor 120 disposed in the inner barrel 130 to be exposed to the outside of the inner barrel 130 as shown in FIGS. 1 to 3.

To this end, the inner barrel 130 is connected to the driving part 140 disposed outside the housing 110 via a power transmission part 150 as a medium so that the entire inner barrel 130 is lifted or lowered in an upward or downward direction by the driving part 140.

In other words, the power transmission part 150 according to one embodiment of the present invention includes a plurality of support rods 152 connected to a side portion of the inner barrel 130 via lower ends thereof and extending predetermined height upward, and an upper frame 154 connecting upper end portions of the support rods 152 to each other. Here, the upper frame 154 is connected to the driving part 140 to transmit a driving force to the upper frame to lift or lower the upper frame in the upward or downward direction.

Here, the driving part 140 may be a cylinder in which a piston rod 142 having a predetermined length is linearly reciprocated by a driving motor, and an end of the piston rod 142 is coupled to the upper frame 154.

In this case, the inner barrel 130 is disposed such that the protrusion 134 is in contact with the side portion of the showerhead 160 and the lower edge of the inner barrel 130 is in contact with the bottom surface of the housing 110. Accordingly, when the substrate 101 or the susceptor 120 is replaced through the gate valve 180, the inner barrel 130 is moved upward by a driving force transmitted from the driving part 140, and the protrusion 134, which is in contact with the showerhead 160, guides a moving direction thereof.

At this time, since the inner barrel 130 is moved up to a position where the lower edge thereof is positioned above the substrate 101 or the susceptor 120, the substrate 101 or the susceptor 120 disposed in the inner barrel 130 is exposed to the outside of the inner barrel 130.

Due to the above, the substrate 101 or the susceptor 120 placed on the support block 170 is replaced in the vacuum state by the robot arm that enters through the gate valve 180, the inner barrel 130 is then lowered and returned to an original position thereof by the driving part 140 so that the lower edge of the inner barrel is in contact with the bottom surface of the housing 110, and thereby a deposition process for a new substrate 101 placed on the support block 170 can be continuously performed.

Figure 4:
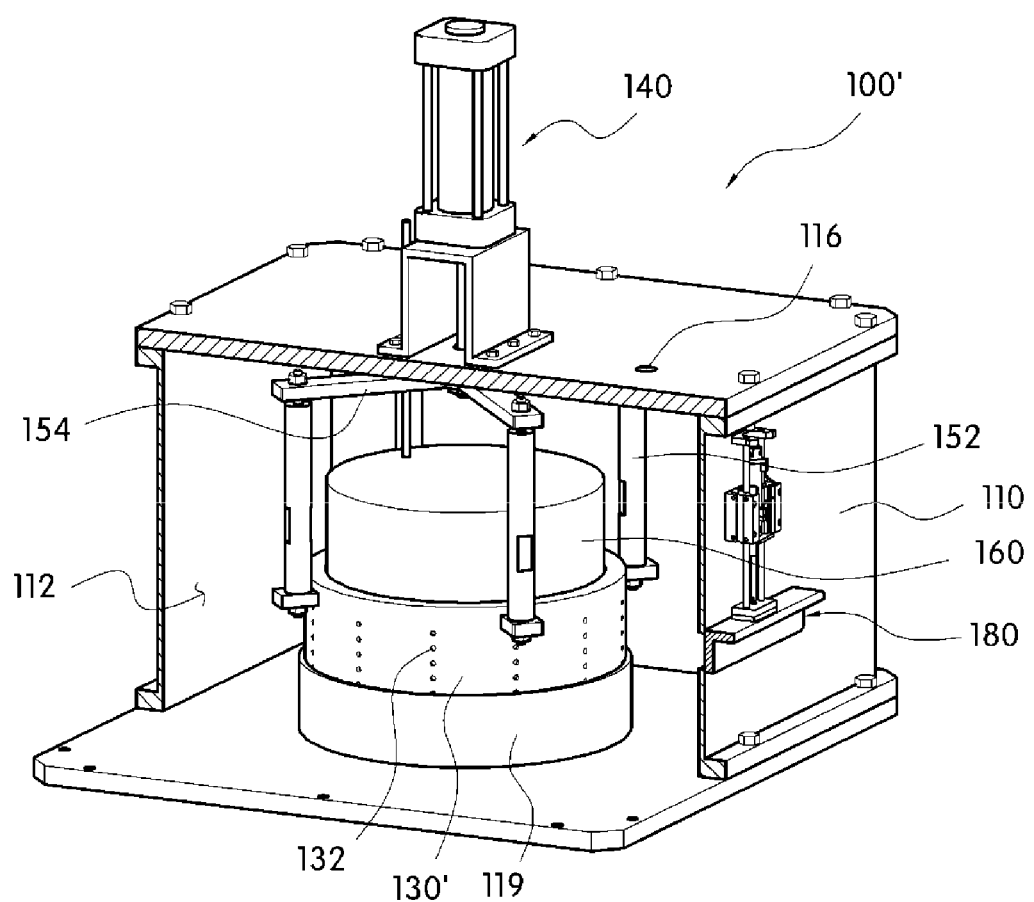
FIG. 4 is a perspective view illustrating an entire reaction chamber for a chemical vapor apparatus according a second embodiment of the present invention.
Figure 5:
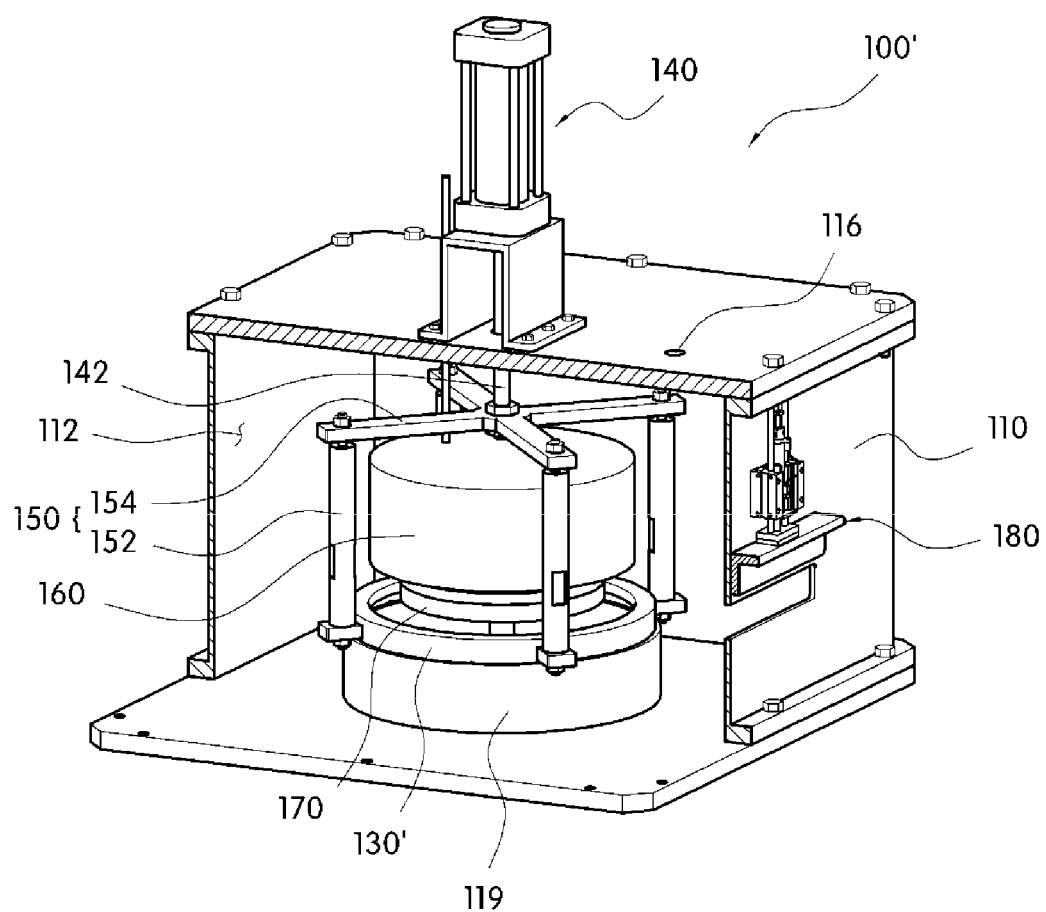
FIG. 5 is a view illustrating a state in which an inner barrel is lowered to replace a substrate or a susceptor in FIG. 4.
Figure 6:
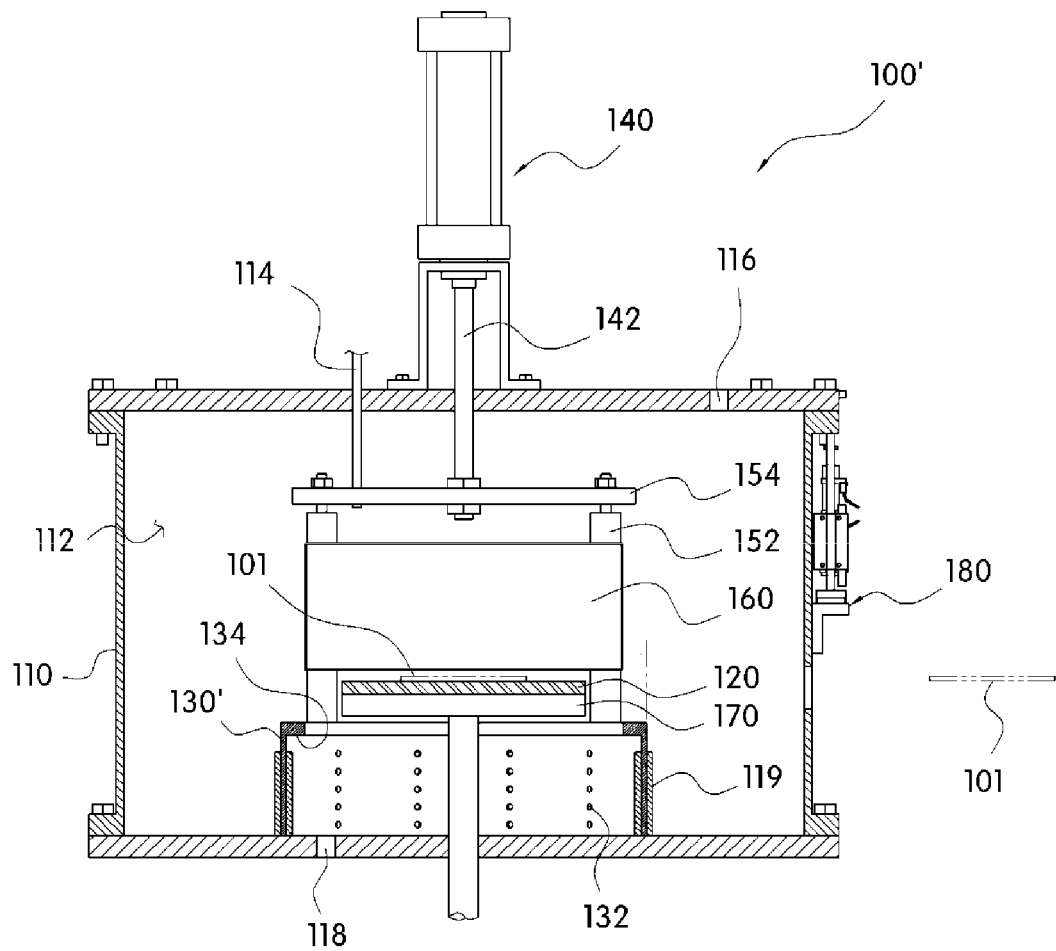
FIG. 6 is a cross-sectional view illustrating the reaction chamber for a chemical vapor apparatus according the second embodiment of the present invention.

As shown in FIGS. 4 to 6, meanwhile, the inner barrel 130' of the reaction chamber 100' for a chemical vapor apparatus according to one embodiment of the present invention may be disposed so that the protrusion 134 is in contact with the side portion of the showerhead 160 and the lower edge is spaced a predetermined height away from the bottom surface of the housing 110.

In this case, when the substrate 101 or the susceptor 120 is replaced through the gate valve 180, the inner barrel 130 receives the driving force from the driving part 140 and is then moved downward.

At this time, since the inner barrel 130' is lowered to a position where the upper edge thereof is positioned below the substrate 101 or the susceptor 120, the substrate 101 or the susceptor 120 disposed in the inner barrel 130' is exposed to the outside of the inner barrel.

Due to the above, the substrate 101 or the susceptor 120 placed on the support block 170 is replaced in the vacuum state by the robot arm that enters through the gate valve 180, the inner barrel 130' is then lifted and returned to an original position thereof by the driving part 140 so that the lower edge of the inner barrel is spaced a predetermined height away from the bottom surface of the housing 110 and a deposition process for the new substrate 101 placed on the support block 170 can be continuously performed.

At this time, a guide member 119 may be provided on the bottom surface of the housing 110 to protrude the predetermined height from the bottom surface of the housing 110, wherein the lower edge of the inner barrel 130' is inserted into the guide member to guide the moving direction of the inner barrel 130' when the inner barrel 130' is lifted or lowered.

Here, the guide member 119 is configured to have an appropriate height to place an upper end thereof below the gate valve 180.

Figure 7:
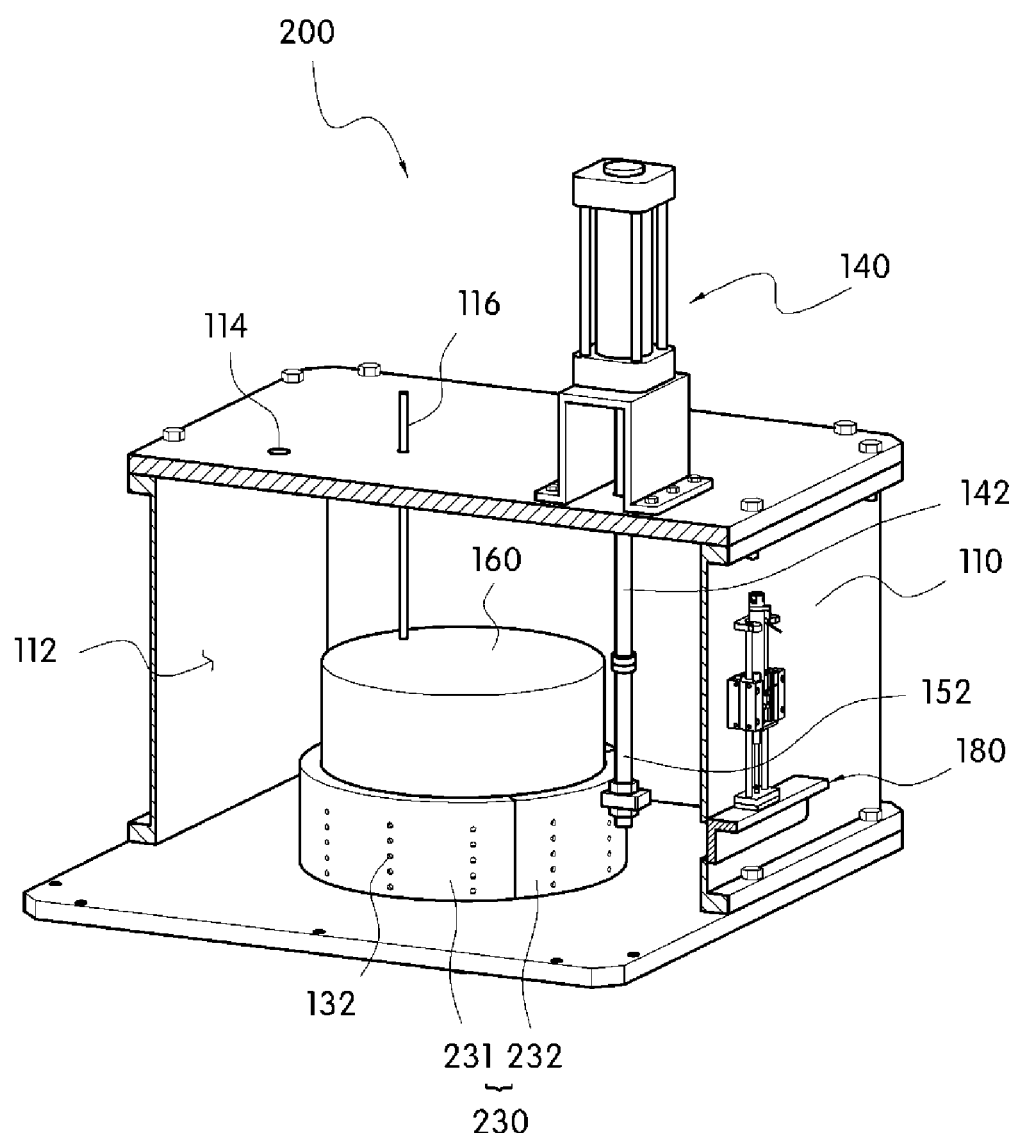
FIG. 7 is a perspective view illustrating an entire reaction chamber for a chemical vapor apparatus according a third embodiment of the present invention.
Figure 8:
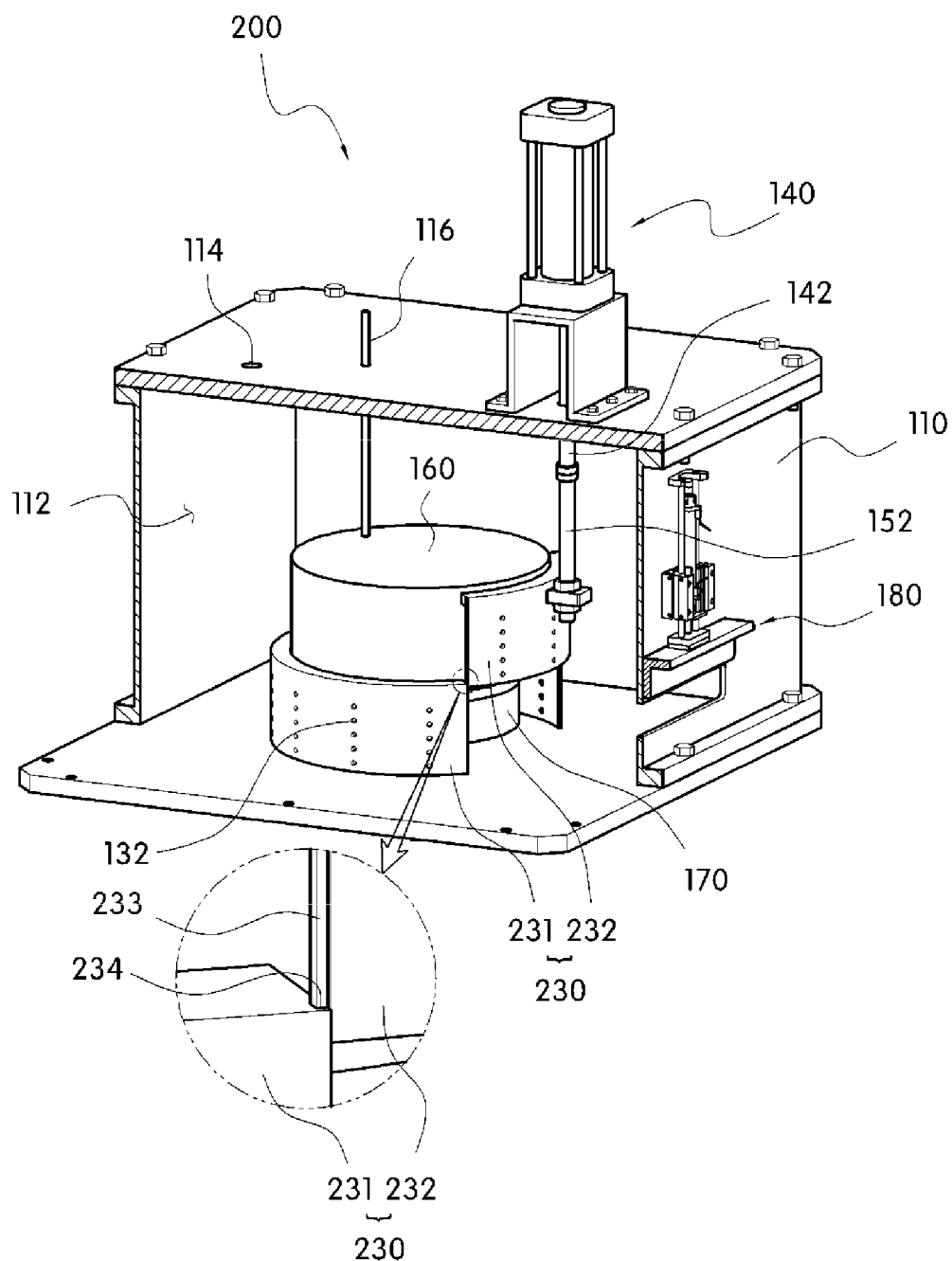
FIG. 8 is a view illustrating a state in which a second section of an inner barrel is lifted to replace a substrate or a susceptor in FIG. 7.
Figure 9:
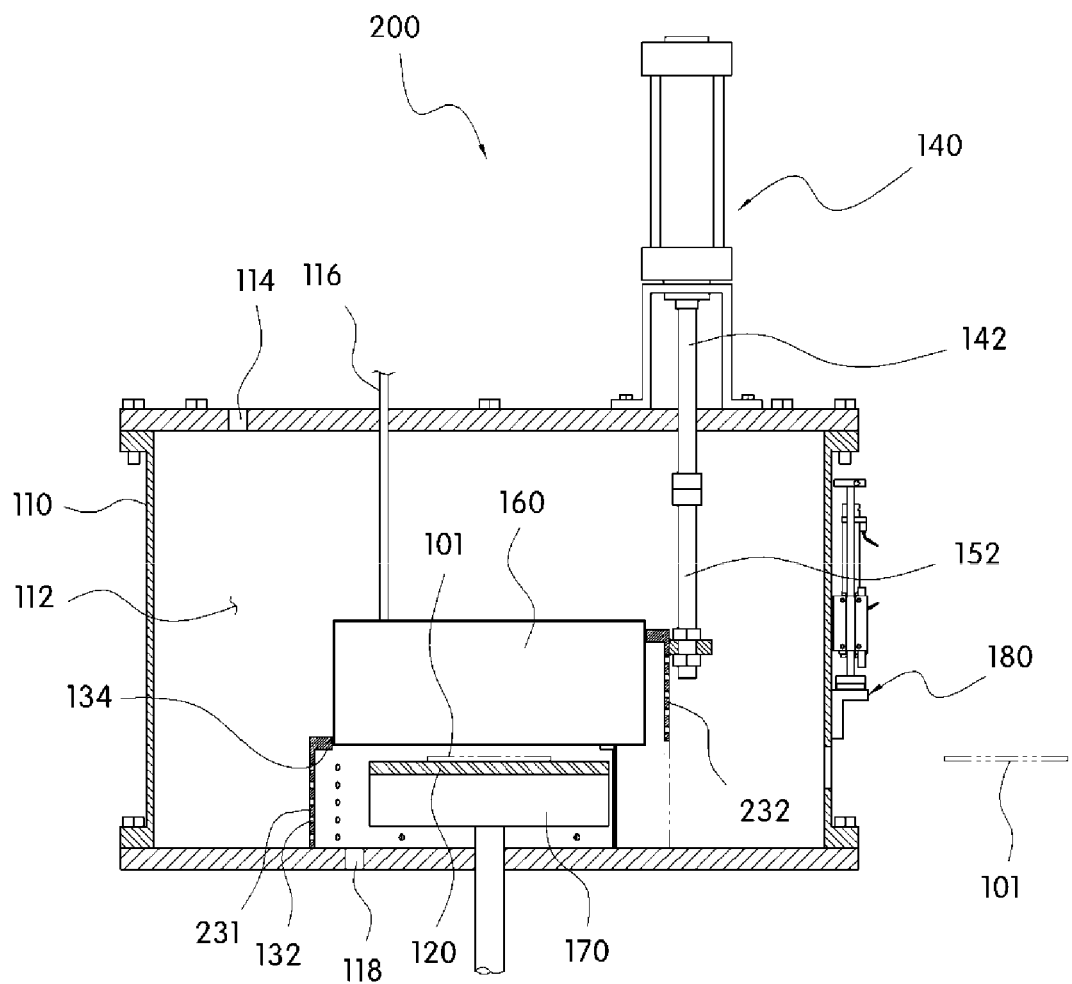
FIG. 9 is a cross-sectional view illustrating the reaction chamber for a chemical vapor apparatus according the third embodiment of the present invention.

As shown in FIGS. 7 to 9, meanwhile, the inner barrel 230 provided in the reaction chamber 200 for a chemical vapor apparatus according to one embodiment of the present invention may be provided with a first section 231 and a second section 232 which have shapes corresponding to each other so as to be merged each other and may also be provided to lift or lower only the second section 232 in a height direction with respect to the first section 231 by the driving part 140 when the substrate 101 and the susceptor 120 are replaced through the gate valve 180.

Here, the second section 232 is provided to have an area which is relatively smaller than that of the first section 231, and protrusions 134 are provided on upper edges of the first section 231 and the second section 232 to protrude inward so that the protrusions are in contact with the side portion of the showerhead 160. In addition, the first section 231 and the second section 232 are disposed to be in contact with the bottom surface of the housing 110.

In addition, a power transmission part connected to the inner barrel 230 includes the support rod 152 having a predetermined length, and a lower end of the support rod 152 is connected to a side portion of the second section 232, and an upper end thereof is directly connected to the driving part 140.

Due to the above, when the substrate 101 or the susceptor 120 is replaced, only the second section 232 is lifted by a certain height by the driving part 140 to open the interior of the inner barrel 230. Here, the second section 232 serves as a kind of door for opening or closing the inside of the inner barrel 230.

At this time, a protrusion 233 and a groove 234 which correspond to each other in the height direction are respectively formed on contact surfaces of the first and second sections 231 and 232 so that the protrusion 233 may be slidably engaged with the groove 234. Due to the above, when the second section 232 is lifted or lowered, the protrusion 233 is moved in a sliding manner along the groove 234 and a moving direction thereof is guided so that a smooth upward/downward movement can be performed.

In addition, a lower end of the groove 234 is provided as a closed end so that a lower end of the protrusion 233 is caught by the closed end of the groove 234 to limit a lifting/lowering distance of the second section 232.

In the reaction chamber for a chemical vapor apparatus according to one embodiment of the present invention, a substrate or a susceptor disposed in the inner barrel is exposed to the outside of the inner barrel in the state in which the vacuum is maintained, and the substrate or the susceptor can then be easily replaced by the robot arm passing through the gate valve in the state in which the vacuum is maintained.

Meanwhile, even though the reaction chamber in which a part of or the entirety of the inner barrel is lifted or lowered in the housing so that the substrate or the susceptor disposed in the inner barrel is exposed to the outside of the inner barrel when the substrate or the susceptor disposed in the inner barrel is replaced is described, the present invention is not limited to the above configuration, and it should be noted that the present invention may adopt an approach in which a part of the inner barrel or the entirety of the inner barrel is rotated by the driving part to change the state of the inner barrel into an open state in which the substrate or the substrate disposed inner barrel is exposed to the outside.

Even though one exemplary embodiment of the present invention has been described, the spirit of the present invention is not limited to the embodiment disclosed in the specification, those skilled in the art and who understand the spirit of the present invention may readily suggest other embodiments by adding, changing, deleting, and the like structural elements within the scope of the same spirit, and these embodiments may also be encompassed in the scope of the present invention.

The invention claimed is:

1. A reaction chamber for a chemical vapor apparatus, comprising:
    a housing having an internal space;
    a susceptor disposed in the internal space and provided so that a substrate is loaded on an upper surface thereof;
    a showerhead disposed in the internal space to be placed above the susceptor and provided to spray a process gas toward a substrate;
    an inner barrel formed in a hollow shape having an open upper portion, an open lower portion, and a predetermined height, spaced apart from an inner vertical wall of the housing, including a plurality of through holes formed therein so that a purge gas injected into a space between the inner wall of the housing and an outside of the inner barrel flows from the outside of the inner barrel to an inside of the inner barrel by passing only through the through holes, and being disposed in the internal space of the housing so that an upper edge thereof is positioned at a periphery of the showerhead to surround the substrate and the susceptor; and
    a connecting rod located between the inner barrel and a ceiling plate of the housing, being mounted through the ceiling plate of the housing, then connected to the inner barrel for transmitting an up and down movement of the connecting rod to the inner barrel,
    wherein, for replacing the susceptor or the substrate, a state of the inner barrel is changed into an open state in which the substrate or the susceptor disposed in the inner barrel are exposed to the outside of the inner barrel by an operation of the driving part connecting rod.

2. The reaction chamber of claim 1, wherein a gate valve is provided on a side portion of the housing at a location corresponding to a location of the susceptor, and the susceptor or the substrate is loaded or unloaded through the gate valve to perform a replacement process of the susceptor or the substrate.

3. The reaction chamber of claim 1, wherein the inner barrel is provided with a first section and a second section having shapes that are merged with each other, and only the second section is lifted or lowered along a height direction with respect to the first section by the up/down movement of the connecting rod.

4. The reaction chamber of claim 3, wherein a contact surface of the first section and a contact surface of the second section are respectively provided with a protrusion and a groove corresponding to each other so that the protrusion is slidably inserted into the groove, and the protrusion or the groove slides along the corresponding groove or the corresponding protrusion when the second section is lifted or lowered.

5. The reaction chamber of claim 1, wherein the inner barrel is disposed to space a lower edge thereof by a predetermined height away from the bottom surface of the housing and, for replacing the susceptor or the substrate, the inner barrel is lowered downward to position the upper edge below the susceptor.

6. The reaction chamber of claim 1, wherein a guide member is provided on the bottom surface of the housing to protrude the predetermined height from the bottom surface of the housing, and a lower edge of the inner barrel is inserted into the guide member to guide a moving direction of the inner barrel when the inner barrel is lifted or lowered.

7. The reaction chamber of claim 1, wherein the inner barrel is provided with a protrusion extending inward from the upper edge of the inner barrel and being disposed to be in contact with a side portion of the showerhead via an end portion thereof.

8. The reaction chamber of claim 7, wherein for replacing the susceptor or the substrate, the inner barrel is lifted by a predetermined height upward to position a lower edge of the inner barrel above the susceptor.

\* \* \* \* \*